(12) United States Patent
Tu

(10) Patent No.: US 12,354,693 B2
(45) Date of Patent: Jul. 8, 2025

(54) MEMORY CHIP

(71) Applicant: Winbond Electronics Corp., Taichung (TW)

(72) Inventor: Ying-Te Tu, Taichung (TW)

(73) Assignee: Winbond Electronics Corp., Taichung (TW)

(\*) Notice: Subject to any disclaimer, the term of this patent is extended or adjusted under 35 U.S.C. 154(b) by 154 days.

(21) Appl. No.: 18/303,580

(22) Filed: Apr. 20, 2023

(65) Prior Publication Data

US 2024/0312555 A1  Sep. 19, 2024

(30) Foreign Application Priority Data

Mar. 17, 2023 (TW) ................. 112109992

(51) Int. Cl.
*G11C 29/54* (2006.01)
*G11C 5/02* (2006.01)
*G11C 5/14* (2006.01)

(52) U.S. Cl.
CPC ............ *G11C 29/54* (2013.01); *G11C 5/025* (2013.01); *G11C 5/144* (2013.01)

(58) Field of Classification Search
CPC ......... G11C 29/54; G11C 5/025; G11C 5/144; G11C 2207/108; G11C 5/063; G11C 7/10; G11C 7/1048; G11C 2207/105; G11C 5/14

USPC .......................................... 365/201
See application file for complete search history.

(56) References Cited

U.S. PATENT DOCUMENTS

| | | | |
|---|---|---|---|
| 8,004,870 B2 * | 8/2011 | Tu ............. | G11C 5/02 |
| | | | 365/189.05 |
| 8,400,870 B2 * | 3/2013 | Tu ............. | G11C 8/04 |
| | | | 365/230.04 |
| 2003/0080780 A1 * | 5/2003 | Okamoto ....... | G11C 7/1057 |
| | | | 326/83 |
| 2012/0025898 A1 | 2/2012 | Chen | |

FOREIGN PATENT DOCUMENTS

TW         426519       2/2014

\* cited by examiner

*Primary Examiner* — Amir Zarabian
*Assistant Examiner* — Minh Dinh
(74) *Attorney, Agent, or Firm* — JCIPRNET

(57) ABSTRACT

Disclosed is a memory chip including a plurality of first power pads and a first bus. The first bus is connected to the first power pads. One of the first power pads is coupled to the first bus via a switch device. A data width of the memory chip is determined according to a conduction state of the switch device.

9 Claims, 4 Drawing Sheets

MEMORY CHIP

CROSS-REFERENCE TO RELATED APPLICATION

This application claims the priority benefit of Taiwan application serial no. 112109992, filed on Mar. 17, 2023. The entirety of the above-mentioned patent application is hereby incorporated by reference herein and made a part of this specification.

BACKGROUND

Technical Field

The disclosure relates to a semiconductor chip, and more particularly to a memory chip.

Description of Related Art

Generally speaking, different requirements may be applied to the design of data width of memory chips according to application occasions. A memory chip should be designed to support the requirements of different data widths. When designing a memory chip, an additional bonding pad is usually added for users to determine the data width of the memory chip.

However, although adding an additional bonding pad makes it convenient for users to determine the data width, such approach is not suitable for memory chips with low density because a bonding pad meeting the specification of wire bonding will inevitably occupy a fixed area, and any additional bonding pad will cause redundancy. Moreover, the position of the bonding pad will further restrict the use and layout of the memory chip.

SUMMARY

The disclosure provides a memory chip, which does not require setting of an additional bonding pad, and allows users to determine the data width of the memory chip.

The memory chip of the disclosure includes multiple first power pads and a first bus. The first bus is connected to the first power pad. A power pad among the first power pads is coupled to the first bus through the switch device. The data width of the memory chip is determined according to the conduction state of the switch device.

DESCRIPTION OF THE EMBODIMENTS

Figure 1:
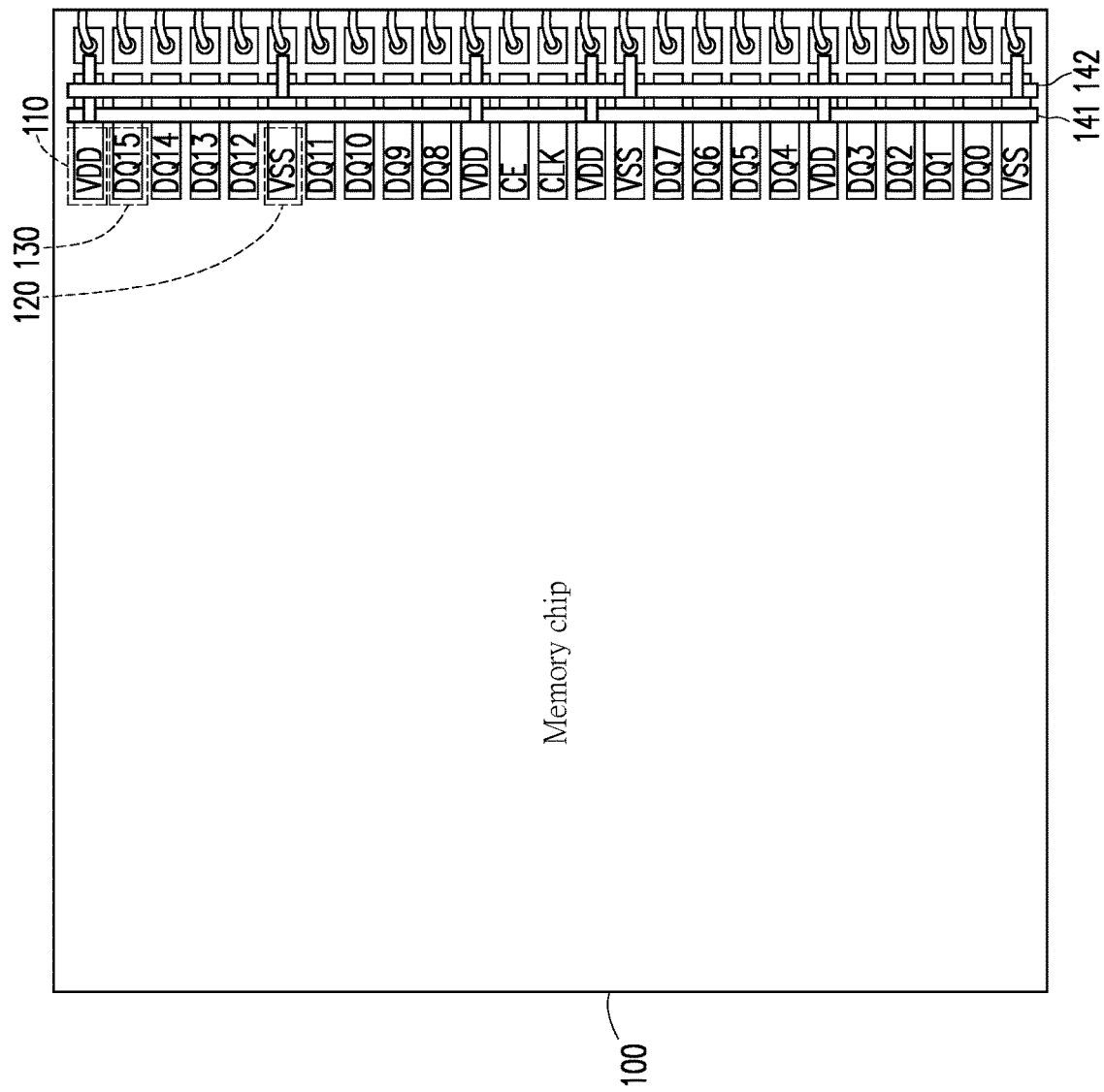
FIG. 1 shows a schematic diagram of a memory chip according to an embodiment of the disclosure.

Please refer to FIG. 1, the memory chip 100 includes multiple first power pads 110, multiple second power pads 120, multiple data pads 130, a first bus 141 and a second bus 142. The first bus 141 is connected to the first power pad 110. The second bus 142 is connected to the second power pad 120.

The first bus 141 is configured to transmit the first power VDD, the second bus 142 is configured to transmit the second power VSS, and the first power VDD is greater than the second power VSS. The first power VDD and the second power VSS are, for example, operating voltages of internal circuits of the memory chip 100. In FIG. 1, the first power pad 110 marked as VDD indicates that it is a pad electrically connected to the first bus 141 and configured to receive the first power VDD; the second power pad 120 marked as VSS indicates that it is a pad electrically connected to the second bus 142 for receiving the second power VSS. The pads labeled as CE and CLK indicate that they are configured to transmit signals CE and CLK.

The data pad 130 is configured to transmit the stored data of the memory chip. In FIG. 1, the data pads 130 marked as DQ0, DQ1, DQ2, DQ3, DQ4, DQ5, DQ6, DQ7, DQ8, DQ9, DQ10, DQ11, DQ12, DQ13, DQ14, and DQ15 indicate that they are pads configured to transmit data bits DQ0 to DQ15. In this embodiment, it is taken as an example that the memory chip 100 includes 16 data pads 130, but the disclosure is not limited thereto. The design of the data width of the memory chip may have different requirements depending on the application occasion, and there are several conventional types of ×4, ×8, ×16, and ×32. The representation of ×16 means that the maximum transmission number of bits of the memory chip 100 is 16 bits, and the representations of ×4, ×8, and ×32 may be deduced in the same way. Therefore, in other embodiments, the memory chip 100 may have 4, 8 or 32 data pads, but the disclosure is not limited thereto.

Any one of the power pads in the embodiment shown in FIG. 1 may have a function as a bonding pad. That is to say, the power pad having the function of the bonding pad may not only be used to receive power, but also may be used by the user to determine the data width of the memory chip 100. The following will give at least one embodiment to further illustrate this concept.

Figure 2A:
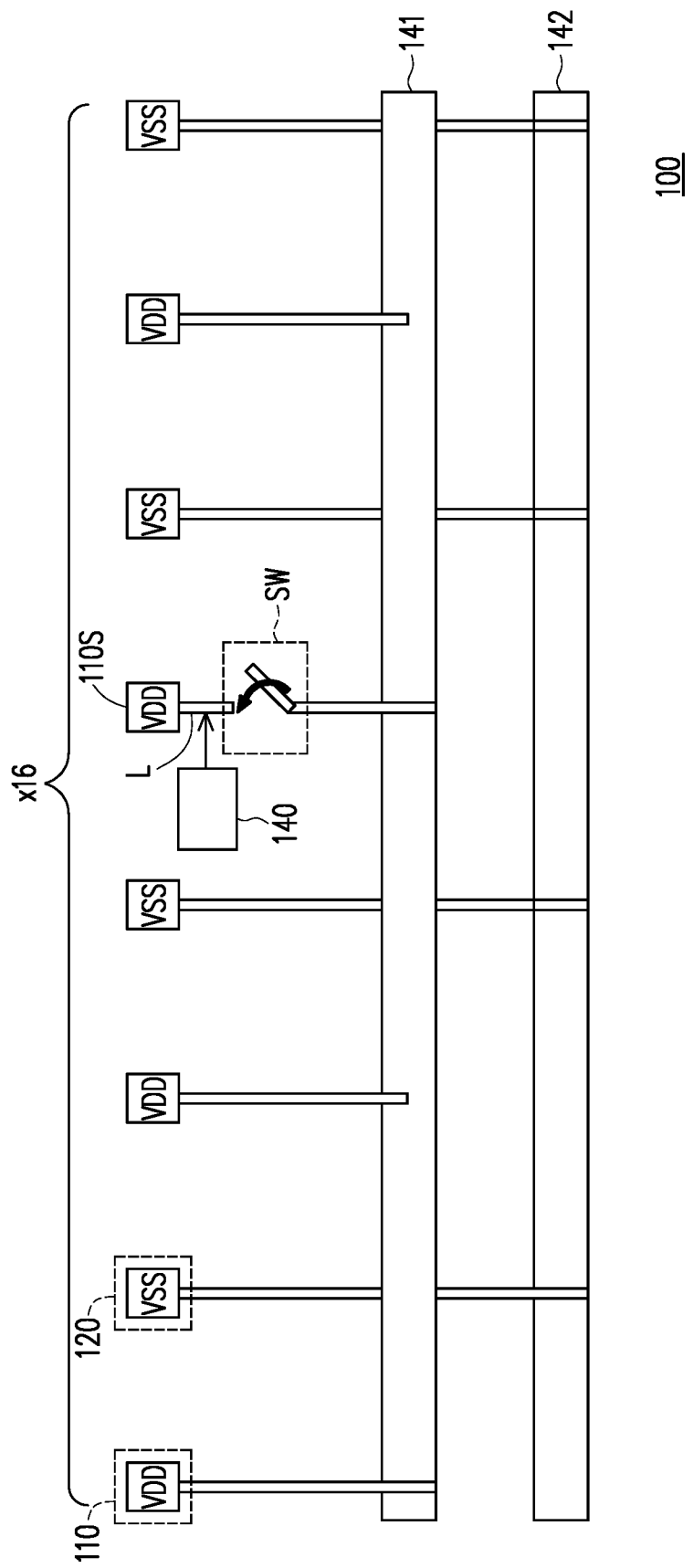
FIG. 2A is a schematic diagram of a memory chip having a first width when a switch device being turned on according to an embodiment of the disclosure.
Figure 2B:
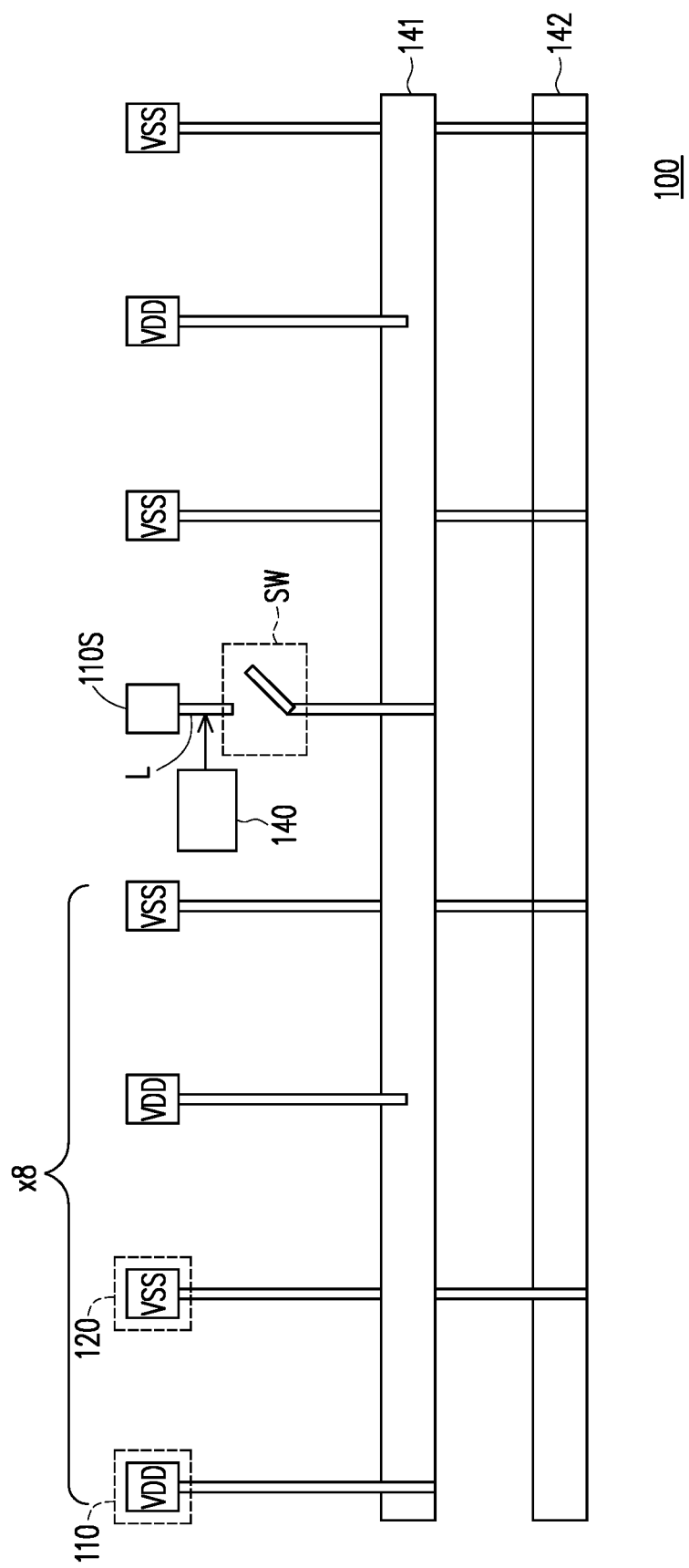
FIG. 2B is a schematic diagram of the memory chip having a second width when the switch device of the embodiment of FIG. 2A being turned off.

FIG. 2A is a schematic diagram of a memory chip having a first width when a switch device being turned on according to an embodiment of the disclosure. FIG. 2B is a schematic diagram of the memory chip having a second width when the switch device of the embodiment of FIG. 2A being turned off. For brevity of description, FIG. 2A and FIG. 2B only show the first power pad 110 and the second power pad 120, but do not show the data pad, and the first power pad 110 and the second power pad 120 are spaced apart from each other. The data pads for transmitting the stored data may be distributed between the first power pad 110 and the second power pad 120. In this embodiment, there are, for example, 16 data pads, wherein 8 data pads are distributed between the first power pad 110 and the second power pad 120 of the two groups on the left, and the other 8 data pads are distributed between the first power pad 110 and the second power pads 120 of the two groups on the right.

In this embodiment, the power pad 110S among the first power pads 110 is coupled to the first bus 141 through the switch device SW, and the data width of the memory chip 100 is determined according to the conduction state of the switch device SW. For example, as shown in FIG. 2A, when the switch device SW is turned on, the data width of the memory chip 100 may be determined to be the first data width, such as 16 bits. As shown in FIG. 2B, when the switch device SW is turned off, the data width of the memory chip 100 may be determined to be the second data width, such as 8 bits. The first data width is larger than the second data width.

In this embodiment, it is taken as an example to design one of the first power pads as a bonding pad for users to determine the data width of the memory chip 100, but the disclosure is not limited thereto. In an embodiment, it is also taken as an example to design one of the second power pads as a bonding pad for users to determine the data width of the memory chip 100, the implementation may also be deduced in the same way.

In addition, the memory chip 100 further includes a judgment circuit 140. The judgment circuit 140 is coupled to the power pad 110S, that is, the power pad coupled to the switch device SW. The judgment circuit 140 is configured to judge the conduction state of the switch device SW. For example, when the judgment circuit 140 detects that the connection line L has the first power VDD, it means that the switch device SW is turned on, and the power pad 110S has the first power VDD at this time. When the judgment circuit 140 detects that the connection line L is floating, it means that the switch device SW is turned off, and the power pad 110S is also in a floating state.

Figure 3:
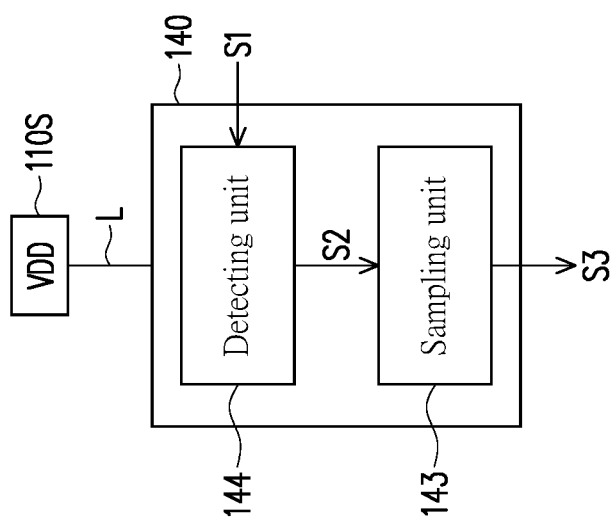
FIG. 3 shows a schematic diagram of a judgment circuit according to an embodiment of the disclosure.

Specifically, FIG. 3 shows a schematic diagram of a judgment circuit according to an embodiment of the disclosure. The judgment circuit 140 also includes a detecting unit 144 and a sampling unit 143. The detecting unit 144 is coupled to the power pad 110S. The detecting unit 144 is controlled by the control signal S1 to generate a detection signal S2 according to the present state of the power pad 110S. For example, the present state of the power pad 110S includes, for example, as shown in FIG. 2A and FIG. 3, that the switch device SW is in a conduction state, and the power pad 110S has a first power VDD; alternatively, the present state of the power pad 110S includes, for example, as shown in FIG. 2B, that the switch device SW is in a non-conductive state, and the power pad 110S is in a floating state. The detection signal S2 includes the information of the present state of the above-mentioned power pad 110S.

The sampling unit 143 is coupled to the detecting unit 144. The sampling unit 143 is configured to receive the detection signal S2. After the detecting unit 144 is enabled by the control signal S1, the sampling unit 143 samples the detection signal S2 to generate the judgment signal S3. The judgment signal S3 further indicates which data width that the memory chip 100 is in. For example, if the information of the detection signal S2 is that the power pad 110S has the first power VDD, the judgment signal S3 may indicate that the data width of the memory chip 100 is, for example, ×16 as shown in FIG. 2A. On the other hand, if the detection signal S2 indicates that the power pad 110S is in a floating state, the judgment signal S3 may indicate that the data width of the memory chip 100 is, for example, ×8 as shown in FIG. 2B. The above-mentioned data widths of ×16 and ×8 are used for illustrative purposes only, and are not intended to limit the disclosure. The control signal S1 is, for example, provided by a controller circuit (not shown) of the memory chip 100, and the judgment signal S3 is, for example, output to the controller circuit.

To sum up, in the embodiment of the disclosure, the function of the bonding pad is combined into the power pad. That is, the power pad of the embodiment of the disclosure is not only used to receive power, but also endowed with the function of a bonding pad, allowing the user to determine the data width of the memory chip. In this way, in addition to maintaining convenience for users, it does not require an additional area of the memory chip to be occupied, which makes the use and layout of the memory chip more flexible.

Although the disclosure has been disclosed above with the embodiments, it is not intended to limit the disclosure. Those skilled in the art may make some changes and modifications without departing from the spirit and scope of the disclosure. The scope of protection of the disclosure should be defined by the scope of the appended patent application.

What is claimed is:

1. A memory chip, comprising:
a plurality of first power pads, configured to receive a first power;
a plurality of second power pads, configured to receive a second power different from the first power; and
a first bus, connected to the first power pads, wherein a power pad among the plurality of first power pads is coupled to the first bus through a switch device, and the power pad among the plurality of first power pads receiving the first power is disposed between two power pads among the plurality of second power pads receiving the second power, wherein a data width of the memory chip is determined according to a conduction state of the switch device,
wherein when the switch device is turned on, the data width of the memory chip is determined to be a first data width; and
when the switch device is turned off, the data width of the memory chip is determined to be a second data width.

2. The memory chip of claim 1, further comprising:
a second bus connected to the plurality of second power pads, wherein the first bus is configured to transmit the first power, and the second bus is configured to transmit the second power.

3. The memory chip of claim 2, wherein the first power is greater than the second power.

4. The memory chip of claim 2, wherein the plurality of first power pads and the plurality of second power pads are spaced apart from each other.

5. The memory chip of claim 4, further comprising a plurality of data pads for transmitting stored data of the memory chip, wherein the plurality of data pads are distributed between the plurality of first power pads and the plurality of second power pads.

6. The memory chip of claim 1, wherein the first data width is greater than the second data width.

7. The memory chip of claim 1, further comprising a judgment circuit coupled to the power pad coupled to the switch device, and the judgment circuit configured to judge the conduction state of the switch device.

8. The memory chip of claim 7, wherein the judgment circuit further comprises:
a detecting unit coupled to the power pad and being controlled by a control signal to generate a detection signal according to a present state of the power pad coupled to the switch device.

9. The memory chip of claim 8, wherein the judgment circuit further comprises:
a sampling unit, coupled to the detecting unit, configured to receive the detection signal, and sample the detection signal to generate a judgment signal after the control signal being enabled, wherein the judgment signal indicates the data width of the memory chip.

* * * * *